United States Patent
Bedau et al.

(10) Patent No.: US 9,721,636 B1
(45) Date of Patent: Aug. 1, 2017

(54) METHOD FOR CONTROLLED SWITCHING OF A MRAM DEVICE

(71) Applicant: Western Digital Technologies, Inc., San Jose, CA (US)

(72) Inventors: Daniel Bedau, San Jose, CA (US); Patrick M. Braganca, San Jose, CA (US); Kurt Allan Rubin, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/009,448

(22) Filed: Jan. 28, 2016

(51) Int. Cl.
*G11C 11/16* (2006.01)
*G11C 11/419* (2006.01)

(52) U.S. Cl.
CPC ...... *G11C 11/1675* (2013.01); *G11C 11/1673* (2013.01); *G11C 11/16* (2013.01); *G11C 11/1659* (2013.01)

(58) Field of Classification Search
CPC . G11C 11/1675; G11C 11/1673; G11C 11/16; G11C 11/1659
USPC .............................. 365/158, 189.07, 189.15
See application file for complete search history.

(56) References Cited

U.S. PATENT DOCUMENTS

| | | | |
|---|---|---|---|
| 6,606,262 B2 | 8/2003 | Perner | |
| 6,650,564 B1 | 11/2003 | Earl et al. | |
| 7,088,608 B2 | 8/2006 | DeHerrera et al. | |
| 7,184,300 B2 | 2/2007 | Korkin et al. | |
| 8,213,220 B2 | 7/2012 | Wang et al. | |
| 8,416,605 B2 * | 4/2013 | Kono | G11C 13/0002 365/148 |
| 8,451,655 B2 | 5/2013 | Chung et al. | |
| 2005/0226034 A1 * | 10/2005 | Perner | G11C 11/16 365/158 |
| 2010/0110785 A1 * | 5/2010 | Chen | G11C 7/062 365/171 |
| 2010/0232206 A1 * | 9/2010 | Li | G11C 11/16 365/148 |

(Continued)

FOREIGN PATENT DOCUMENTS

EP 2804180 A1 11/2014

OTHER PUBLICATIONS

Avoiding Unnecessary Write Operations in STT-MRAM for Low Power Implementation.pdf <http://cdnc.itec.kit.edu/downloads/Papers/Bishnoi14ISQED.pdf>.

(Continued)

*Primary Examiner* — Ly D Pham
(74) *Attorney, Agent, or Firm* — Patterson & Sheridan, LLP

(57) ABSTRACT

A method and apparatus for controlled switching of a magnetoresistive random access memory device is disclosed herein. The method includes delivering a current to a magnetoresistive random access memory device, wherein the MRAM device is in a first state, measuring a voltage drop across the magnetoresistive random access memory device in real-time with a resistance detector, wherein a voltage drop beyond a threshold voltage equates to switching from a first state to a second state, the first state different from the second state, determining whether the MRAM device has switched from the first state to the second state, and stopping the current delivered to the magnetoresistive random access memory device.

9 Claims, 5 Drawing Sheets

(56) References Cited

U.S. PATENT DOCUMENTS

2010/0238721 A1* 9/2010 Wang .................. G11C 11/16
 365/171
2016/0267969 A1* 9/2016 Ogiwara ............. G11C 13/004

OTHER PUBLICATIONS

Switching distributions and write reliability of perpendicular spin torque MRAM <http://ieeexplore.ieee.org/stamp/stamp.jsp?tp=&arnumber=5703349&isnumber=5703218>.

* cited by examiner

METHOD FOR CONTROLLED SWITCHING OF A MRAM DEVICE

BACKGROUND OF THE DISCLOSURE

Field of the Disclosure

Embodiments of the present disclosure generally relate to a method for controlled switching of a magnetoresistive random-access memory (MRAM) device, and more particularly to control switching of an MRAM device in real time.

Description of the Related Art

Magnetoresistive random-access memory (MRAM) is a non-volatile random-access memory technology. Unlike conventional RAM, data in MRAM devices are not stored as electric charge or current flows. Rather, data is stored by magnetic storage elements. MRAM devices include cells or elements having a magnetically hard layer (i.e., a "reference" layer) and a magnetically soft layer (i.e., the "free" layer). Writing to MRAM is performed by passing current through current leads that are formed on either side of each memory element in order to create a local induced magnetic field, which sets the direction of the soft layer magnetization. Significant problems arise when scaling these devices to high densities. Particularly, disturbances to neighboring cells or elements can occur during wiring, which in turn may cause a neighboring cell to be erroneously written.

Spin transfer torque (STT) MRAM devices are similar to conventional MRAM devices except that the current paths pass through the magnetic layers of each memory element. A free layer is one of the magnetic layers in the MRAM device. The orientation of the free layer is changed by the action of angular momentum transfer from a spin-polarized current created by passing current through another magnetic layer.

Spin orbit torque (SOT) MRAM devices are similar to STT-MRAM devices except that the read and write paths are independent. Because the read and write paths in a SOT-MRAM device are independent, the current densities passing through SOT-MRAM devices can be significantly lower than in STT-MRAM devices, which may result in better device endurance.

MRAM devices contain arrays of MRAM cells. There are a number of different architectures in which the cells can be arranged. In one architecture, a two terminal MRAM cell is arranged in a 1T-1R format where 1T refers to select transistor and 1R refers to the MRAM device. The array is built up with a set of electrically conducting lines, called bit-lines, source-lines, and word-lines. One side of a set of MRAM cells are connected to a bit-line. The other side of a set of MRAM cells is connected to a source-line. The gates of the transistors are connected to word-lines. The MRAM device is connected in series with the source and drain of the transistor.

A read sense amplifier is connected to the bit-lines and measures the voltage on the bit-line for reading while the write driver is off. A write sense amplifier is used to measure the voltage on or the current through the MRAM device while the write current is on. In some embodiments the read and write amplifiers may use some of the same circuitry.

When the select transistor is turned on, a voltage or current is applied to the MRAM cell. The resistance of the MRAM device depends upon the magnetic state of the MRAM. If the voltage or current is at a sufficiently low level, the magnetic state of the MRAM cell will be unaffected and that voltage or current can be used to read the state of the MRAM device without reprogramming or rewriting it. If the read voltage or read current is sent to the MRAM device, the read voltage or read current is affected by the resistance of the MRAM device. If the MRAM device is in one magnetic state the read voltage or read current will have one value and will cause the sense amplifier to produce one voltage. If the MRAM device is in a second magnetic state, its resistance will be a second value and the read voltage produced by the sense amplifier will be a different value. The sense amplifier produces a voltage related to the resistance of the MRAM device. In practice there is noise in the system so the signal produced by the sense amplifier from a particular MRAM cell will fluctuate due to that noise. In practice it is not possible to make each MRAM cell identical. Therefore, the resistance of a set of MRAM cells will be different, even if they are in the same state. The resistance of that set of cells in a different magnetic state will also differ from one another. But for a particular MRAM device the resistance of different states of that MRAM device will be different and can be distinguished.

MRAM devices contain elements, or cells, that switch the MRAM device between a first state and a second state. With current methods for switching an MRAM device from a first state to a second state, write failure occurs due to several possible mechanisms, including distributions of write currents in an ensemble of bits or nondeterministic switching due to the specific nature of the write method used. In the former case, writing may be mostly successful but once in a while a write error will occur. The latter case, which is typically referred to as probabilistic switching, makes writing strongly dependent on certain parameters, such as the width of the write voltage/current pulse. While write errors can be mitigated by adding error correction code (ECC), this method adds complexity and cost to the building of memory chips. The use of ECC requires the final state be measured and the write procedure repeated if the device is not in the desired state. This method significantly degrades memory latency because it is time consuming and is not optimal as there is still a non-zero probability for the device to end up in the wrong state even after a large number of tries.

As high density nonvolatile memory devices become increasingly more popular in diverse applications, there is a continual need for improved MRAM devices. Thus, what is needed is an improved method of controlled switching an MRAM device.

SUMMARY OF THE DISCLOSURE

The present disclosure generally relates to a method for controlled switching of a magnetoresistive random-access memory (MRAM) device, and more particularly to control switching of an MRAM device in real time.

In one embodiment, a method for programming a magnetoresistive random access memory (MRAM) device is disclosed herein. The method includes delivering a programming current or a programming voltage to a magnetoresistive random access memory (MRAM) device in a write sense circuit that creates a write sense signal corresponding to the voltage at a MRAM device or the current flowing through the MRAM device, providing a set of criteria that correspond to a desired magnetic state, determining an estimate of the state of the magnetoresistive random access memory device with a state estimator, and stopping the current or voltage delivered to the magnetoresistive random access memory device if the estimated state has met the set of criteria.

In another embodiment, a method for controlling switching of a magnetoresistive random access memory device is disclosed herein. The method includes delivering a current to a magnetoresistive random access memory device, wherein the MRAM device is in a first state, measuring a voltage drop across the magnetoresistive random access memory device in real-time with a resistance detector, wherein a voltage drop beyond a threshold voltage equates to switching from a first state to a second state, the first state different from the second state, determining whether the MRAM device has switched from the first state to the second state, and stopping the current delivered to the magnetoresistive random access memory device.

In another embodiment, a system for controlling switching of a magnetoresistive random access memory device is disclosed herein. The system includes a write drive, a resistance detector, and a controller. The write drive is configured to deliver a current to the MRAM device. The resistance detector is in parallel with the MRAM device. The resistance detector measures a voltage drop across the MRAM device in real-time. The controller is configured to compare the voltage drop measured by the resistance detector to a threshold value. The controller communicates with the write drive to provide the write current until the threshold value is met.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered an element or limitation of the appended claims except where explicitly recited in a claim(s).

The present disclosure relates to a method and apparatus for controlled switching of a magnetoresistive random access memory device. The method includes delivering a current to a magnetoresistive random access memory device, wherein the MRAM device is in a first state, measuring a voltage drop across the magnetoresistive random access memory device in real-time with a resistance detector, wherein a voltage drop beyond a threshold voltage equates to switching from a first state to a second state, the first state different from the second state, determining whether the MRAM device has switched from the first state to the second state, and stopping the current delivered to the magnetoresistive random access memory device.

Figure 1A:
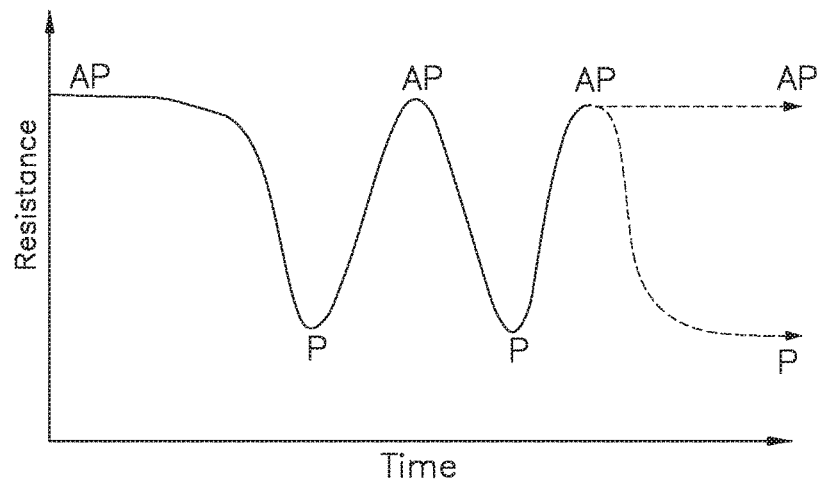
FIGS. 1A-1C illustrate examples of how the signal from the MRAM cell magnetization oscillates between parallel (P) and anti-parallel (AP) states, according to one embodiment.
Figure 1B:
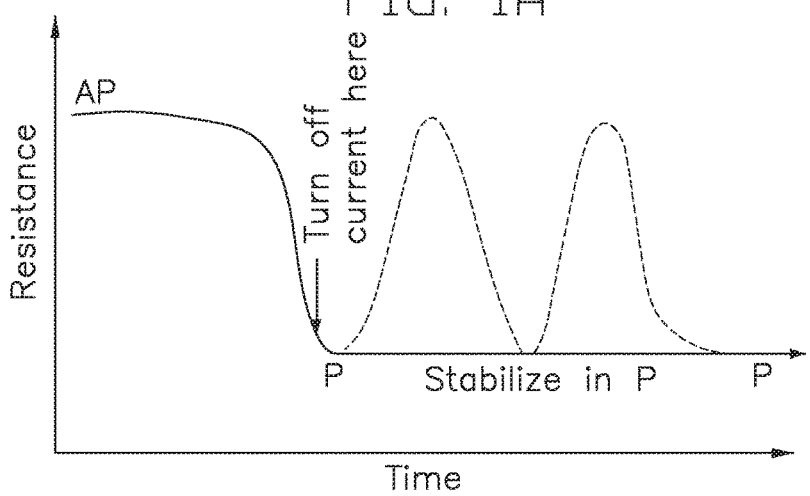
Figure 1C:
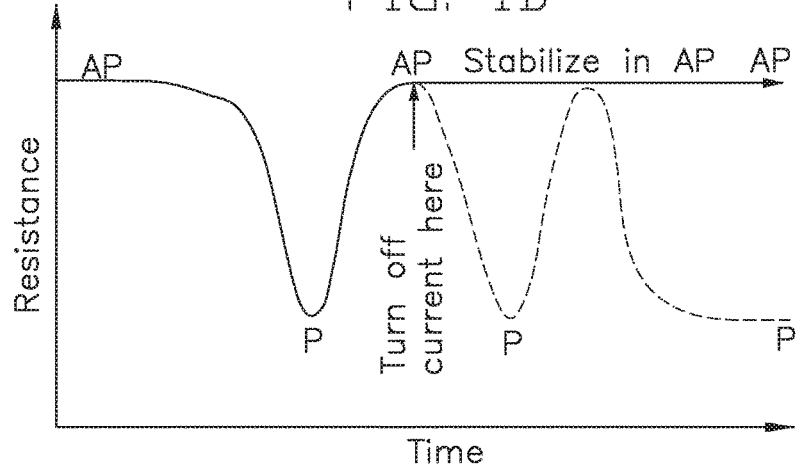

FIGS. 1A-1C illustrate examples of how the signal from the MRAM cell magnetization oscillates between parallel (P) and anti-parallel (AP) states when using write mechanisms such as orthogonal spin transfer (OST) or voltage controlled magnetization anisotropy (VCMA). The write voltage or current is turned off at a time in phase with the P or AP state and causes the P or AP state to be achieved. In some embodiments the write voltage or current is turned off at a time earlier than when the magnetization has reached the P or AP state, in order to accommodate propagation delay in the circuit between the time in which the signal is sent to turn off the write voltage or current and when that write voltage or current turns off at the actual MRAM cell. This delay can vary depending upon where in the MRAM device array the MRAM cell is located.

Figure 2:
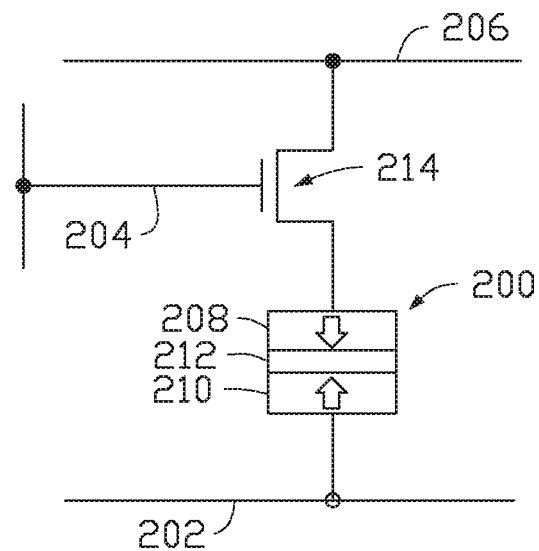
FIG. 2 illustrates an element of a two-terminal magnetic random access memory cell connected to a word-line through an access transistor, bit-line, and source-line, according to one embodiment.

FIG. 2 illustrates an MRAM cell 200 with perpendicular anisotropy that is part of an array of MRAM cells and is connected to a bit-line 202, word-line 204, and source-line 206. This MRAM cell 200 is a 2-terminal MRAM cell. A greatly simplified MRAM cell 200 is drawn, consisting of a fixed (or reference) layer 208, a free layer 210 that rotates between one of two perpendicular orientations, and a tunnel barrier 212 that separates the free 210 and fixed layer 208. The access transistor 214 can be a CMOS transistor, which is fabricated in the front-end of the line (FEOL), and the MRAM cell 200 can be fabricated in the back-end of the line (BEOL).

In FIG. 2, the free layer 210 is oriented anti-parallel to the fixed layer 208. The anti-parallel orientation has a higher resistance. An MRAM cell 200 can be much more complex than shown in the drawing, with many layers being used to create the fixed layer 208 and many layers used to create the free layer 210, more than one tunnel barrier 212 and additional layers for enabling growth of the free layer 210 and fixed layer 208 with desired microstructures and magnetic properties. Application of a write voltage that reaches the MRAM cell 200 or current that passes through the MRAM cell 200 and is of the appropriate direction and duration will reverse the magnetization of the free layer 210 and cause that free layer 210 magnetization to be aligned in the same direction of the fixed layer 208. The parallel orientation has a lower resistance. In some types of MRAM cells 200, the switching mechanism is via spin-transfer torque (STT) and the write current is bi-polar—it passes through the MRAM cell 200 in one direction to cause the free layer 210 to anti-align to the free layer 210 (higher resistance) and it passes through the MRAM cell 200 in the other direction to cause the magnetization of the free layer 210 to align parallel to the fixed layer 208 (lower resistance).

In one embodiment the switching of the MRAM cell 200 is caused by applying an electric field across the MRAM cell 200, which reduces the perpendicular anisotropy and allows the free layer 210 to rotate towards an in-plane orientation. This is denoted Voltage Controlled Magnetic Anisotropy (VCMA) MRAM. Often the write voltage is of one polarity but the width of the write pulse is varied. This is called unipolar writing. While the voltage is applied, the free layer 210 rotates around an in-plane axis, thereby precessing between parallel and anti-parallel states. The following Figures aid in determining when to turn off the write-current so the free layer ends up in the desired orientation for programming data. In some embodiments the STT and VCMA MRAM may be used together.

Figure 3:
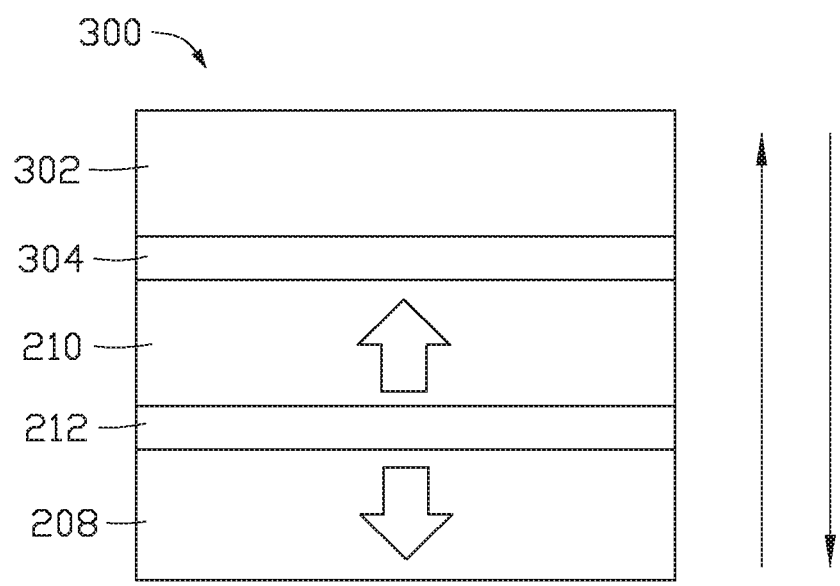
FIG. 3 illustrates an embodiment, where the MRAM cell is an orthogonal spin transfer (OST) cell, according to one embodiment.

FIG. 3 illustrates one embodiment, where the MRAM cell is an orthogonal spin transfer (OST) cell 300. The OST cell 300 includes an additional magnetization layer 302, which is oriented in-plane. The magnetization layer 302 is separated from the free layer 210 by a spacer layer 304. The spacer layer 304 may be formed from a non-magnetic material such as Cu, Ag, or Au or an alloy such as AgSn.

Figure 4:
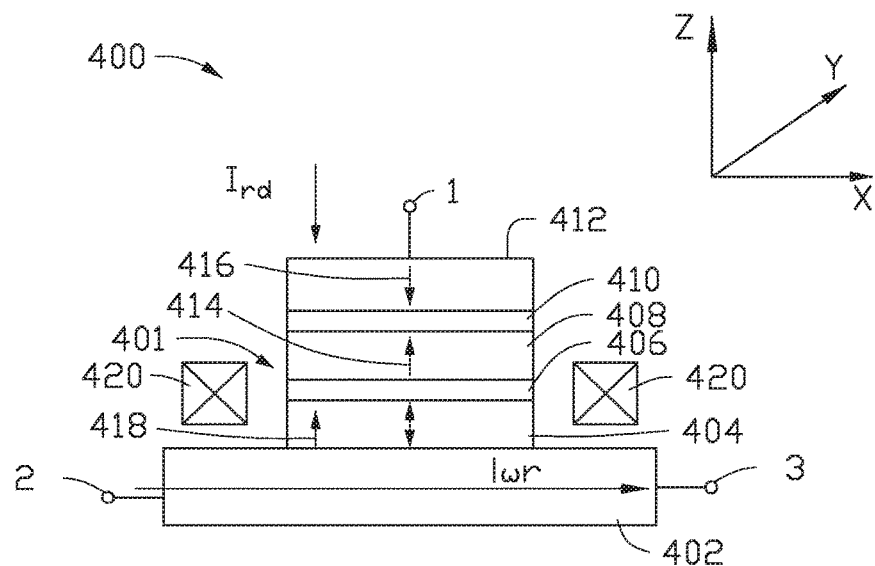
FIG. 4 illustrates an element of a conventional spin orbit torque magnetic random access memory (SOT-MRAM) device, according to one embodiment.

FIG. 4 illustrates an element 400 of an SOT-MRAM, according to one embodiment disclosed herein. The element 400 may be a three-terminal memory cell. The element 400 includes an underlayer 402, a magnetic tunnel junction 401, a ruthenium layer 410, and a pinned layer 412. The magnetic tunnel junction 401 includes a free layer 404, a reference layer 408, and an insulating layer 406 separating the free layer 404 from the reference layer 408. The reference layer 408 and the pinned layer 412 have a fixed magnetization. For example, the reference layer 408 has a fixed magnetization 414 in the upwards z-direction. For example, the pinned layer 412 has a fixed magnetization 416 in the downwards z-direction. The free layer 404's magnetization is free to switch between two uniaxial states: one parallel or one anti-parallel to the directions of the reference layer moment. The two states of magnetization of the free layer 404 may correspond to logical states of 0 and 1. The underlayer 402 may be a heavy metal, such as Pt, Ta, W, Hf, Ir, or alloys of these materials with Cu or Au such as CuBi, CuIr, or AuW. The underlayer 402 is in physical contact with the free layer 404.

The element 400 further includes three terminals: terminal 1, terminal 2, and terminal 3. A write current, $I_{wr}$ may be applied through the underlayer 402 between terminal 2 and terminal 3. A read current, $I_{rd}$, may be applied through the element 400 from terminal 1 to terminal 3.

To write the element 400, the write current is applied through the underlayer 402 between terminal 2 and terminal 3. The magnetic bias field may be obtained by using permanent magnets 420 positioned about the element 400. Both the magnetic bias field and the write current $I_{wr}$ result in in-plane torque 418 acting on the free layer. The torque 418 acts on the initial magnetization of the free layer 404 so that the magnetization may change, for example, from a parallel state to an anti-parallel state. Selectively providing current through the underlayer 402 will deterministically switch the magnetization direction of the free layer 404 between the first polarization state and the second polarization state. By alternating the state of polarization of the free layer 404, information may be written to the SOT-MRAM.

Write failure may occur due to the probabilistic nature of ending in a final state. Typically, writing for VCMA and OST write mechanisms cannot be controlled deterministically. In order to switch the magnetization from a first state to a second state, a write pulse is applied. The state has to be measured, which takes additional time. If the device is not in the desired state, the procedure needs to be repeated. This poses two problems. First, the procedure may take a long time. Second, the procedure is not time bounded. There is a non-zero probability for the device to end up in the wrong state even after a large number of tries. Therefore, an improved method of deterministically switching the device from a first state to a second state is needed.

The methods disclosed herein may be used across multiple elements in an MRAM device to improve write data rates. The methods improve the bit error rates. Improving the signal enhancement results in elements of MRAM devices having a higher reliability of knowing when to turn off the write current. Tracking the switching of the MRAM device in real-time compensates for cell-to-cell variability due to each respective cell having a different switching time (either due to bit distributions or the intrinsic write mechanism used), which also compensates for cell-to-cell temperate variations. As the cell ages over time, the real-time detection compensates for any change in switching time that may occur. The methods are compatible with any MRAM cell design that has a resistance change during state switching, such as, orthogonal spin transfer (OST) MRAM devices, voltage-controlled magnetic anisotropy (VCMA) MRAM devices, perpendicular MRAM devices, and in-plane MRAM devices, and the like. The methods are also compatible with many different MRAM switching mechanisms, such as, voltage switching mechanisms, current switching mechanisms, magnetic switching mechanisms, electric field switching mechanisms, and the like.

Figure 5:
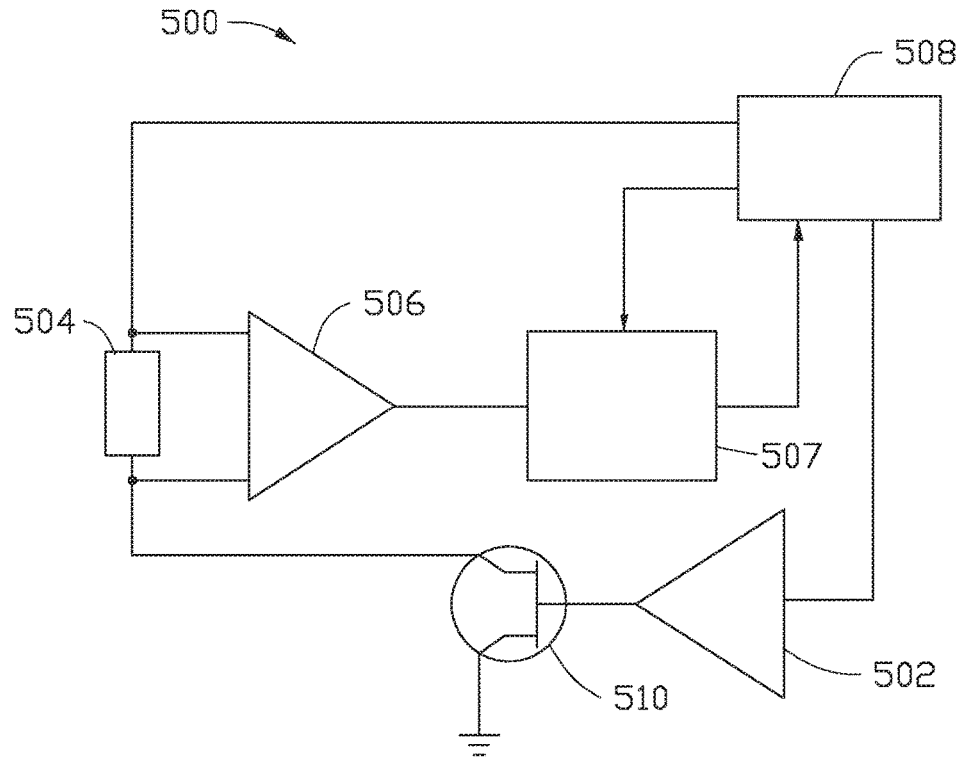
FIG. 5 illustrates a system for controlling the switching of an MRAM device, according to one embodiment.

FIG. 5 illustrates a system 500 for controlling switching of an MRAM device, according to one embodiment. The system 500 includes a write driver 502, a MRAM device 504, a state detector 506, an interim magnetic state indicator 507, and a controller 508. The write driver 502 is configured to deliver a write current, $I_{wr}$, to the MRAM device 504. The write current, $I_{wr}$, is provided such that a free layer in a first state in the MRAM device 504 will switch from the first state to a second state. The state detector 506 is placed in parallel with the MRAM device 504. The state detector 506 is configured to measure a voltage drop across the MRAM device 504 in real-time and provide this information to the controller 508. The interim magnetic state indicator determines the magnetic state of the MRAM device 504 from the measured resistance. The controller 508 is configured to compare the voltage drop measured by the state detector 506 to a threshold value. The threshold value may be set by the user. The controller 508 communicates with the write driver 502 regarding whether the threshold value has been met. Meeting the threshold value corresponds to the magnetization of the free layer in the MRAM device 504 switching from a first state to a second state. The system 500 may further include a transistor 510, which may be coupled between the write driver 502, MRAM device 504, and ground.

The state detector 506 may use a variety of techniques to determine whether the voltage drop across the MRAM device 504, in real-time, exceeds the threshold amount.

In one embodiment, the state detector 506 uses a burst mode extraction technique. The burst mode extraction may use oversampling, either in space or in time. It may contain one or more voltage controlled oscillators (VCO) which are adjusted in frequency and phase to create a signal that is frequency and phase aligned to the frequency and phase associated with the precession of the magnetization of the free layer between the parallel (P) and anti-parallel (AP) states. Clock and data recovery (hereinafter "CDR") refers to a process when a receiver generates a signal from an approximate frequency signal, and then phase-aligns to the transitions between the P and AP states. The frequency in this case is the frequency with which the voltage signal oscillates back and forth between the P and AP magnetic orientations. The frequency and phase of the magnetization of the free layer can vary from cell to cell and with temperature so burst mode extraction provides an adaptable means of phase and frequency aligning with the oscillation between the P and AP states, enabling a reliable way of deciding when to turn off the write signal just when the MRAM cell is in either the P or AP state. The burst mode extraction refers to application of CDR where the transmission is deliberately started and stopped (or burst), with longer periods of inactivity between bursts, for example periods of time between writing a cell. The burst-mode extraction circuit may be implemented in CMOS and may be shared with one or more arrays of MRAM devices.

In another embodiment, the state detector 506 uses an equalize and peak detect technique. Equalize refers to filtering the signal to modify its temporal shape and its noise to improve the ability to detect the state. In an equalize and peak detect technique, the system 500 further includes a differentiator (not shown) to determine whether the signal hit a maxima or minima. In this case, when the output signal matches a maxima or minima, this even corresponds to a switching of magnetization from a first state to a second state. Equalization refers to filtering the signal. In some variations of the embodiment there are two peak-detect circuits, one to detect positive peaks, and one to detect negative peaks. A criteria for turning off the write current or voltage would be that first a positive and then a negative peak are sequentially detected to indicate one state is reached. Alternatively if first a negative and then a positive peak are sequentially detected then the opposite state has been achieved and the write current is turned off.

In another embodiment, the state detector 506 uses an optimal filter technique. In the optimal filter technique, the system 500 further includes a filter (not shown). The filter may be, for example, a Wiener filter. The filter is matched to the precessional signal of the device. The filter is used as a state estimator for the memory cell to feedback into the timing logic. In other words, the optimal filter is obtained by correlating a known signal with an unknown signal to detect the presence of the known signal in the unknown signal. In this case, the known signal would be the desired signal to detect switching of magnetization from a first state to a second state. The unknown signal would be the output measured from the resistance detector. The output measured by the resistance detector is compared to the known signal to determine whether switching of magnetization occurred.

In another embodiment, the state detector 506 uses a frequency mixer technique. The frequency mixer is a non-linear electric circuit that creates new frequencies from two signals applied to it. Because MRAM devices are non-linear, the MRAM device 504 may act as a mixer if the act of mixing does not excessively disturb the switching process or alternatively another device can be used as a mixer. In this case, the frequency mixer takes the precession frequency signal and shifts it to a lower frequency difference signal (F1−F2). The write signal is then truncated when the difference signal reaches a suitable value.

In another embodiment, the state detector 506 uses a time domain technique. In the time domain technique, the direct time-domain measurement of the current or voltage of the device provides an indication of the current state of the device.

Figure 6:
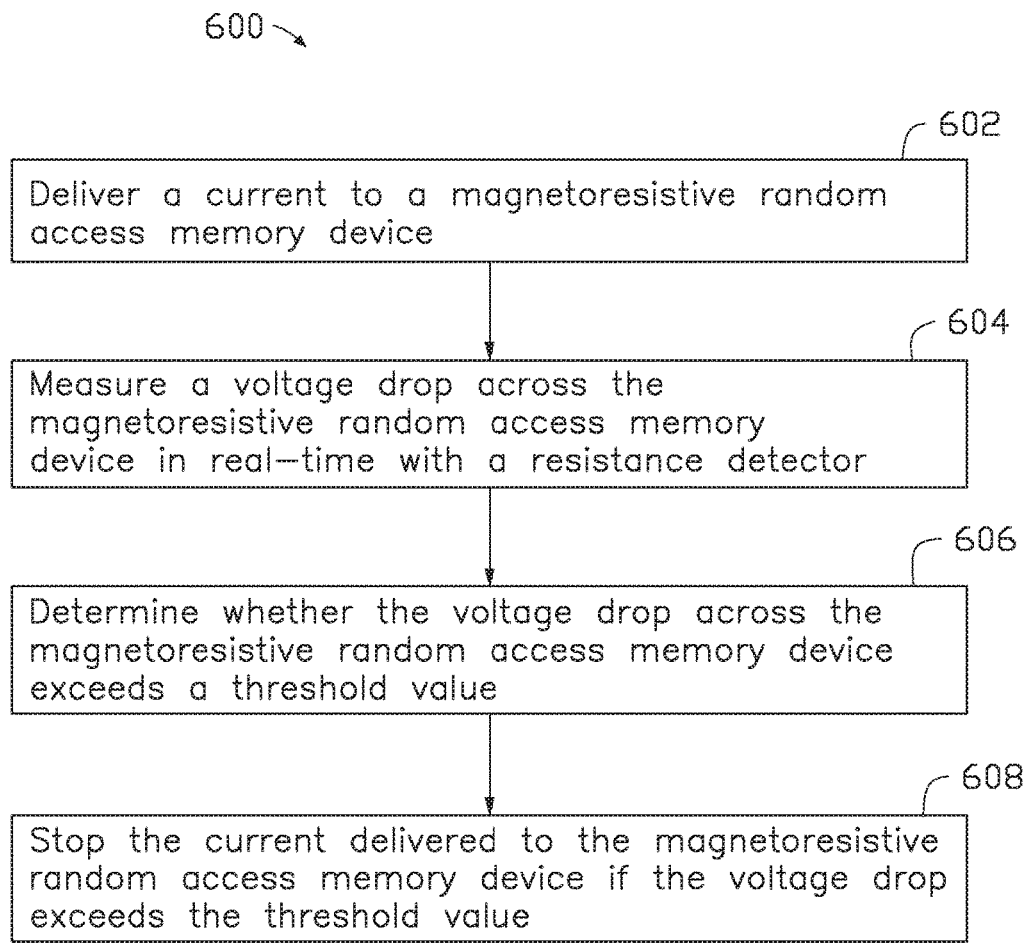
FIG. 6 illustrates an improved method of switching an MRAM device, according to one embodiment.

FIG. 6 illustrates a method 600 of controlling switching of an MRAM device, such as element 400 in FIG. 4, using the system 500. The method 600 begins at step 602. At step 602, a current is delivered to the MRAM device. The current may be a write current, $I_{wr}$, delivered by the write driver 502.

At step 604, the voltage drop across the MRAM device is measured, in real-time, with a resistance detector. The resistance detector may be a state detector 506. The resistance detector may implement any of the above mentioned techniques to measure the voltage drop across the MRAM device, in real-time.

At step 606, a controller, such as controller 508, determines whether the voltage drop measured by the resistance detector exceeds the threshold value. The resistance detector is in communication with the controller to transmit measured values of the voltage drop across the MRAM device. The controller compares the measured values provided by the resistance detector to the threshold value.

At step 608, the controller stops the current delivered to the MRAM device if the voltage drop exceeds the threshold value. If, when the controller compares the measured value provided by the resistance detector to the threshold, the measured value exceeds the threshold value, then the controller communicates with the write drive so that the write drive no longer delivers the current to the MRAM device. If the measured value does not exceed the threshold value, the write drive continues to deliver the current to the MRAM device, and the resistance detector continues to measure the voltage drop across the MRAM device in real-time.

Figure 7:
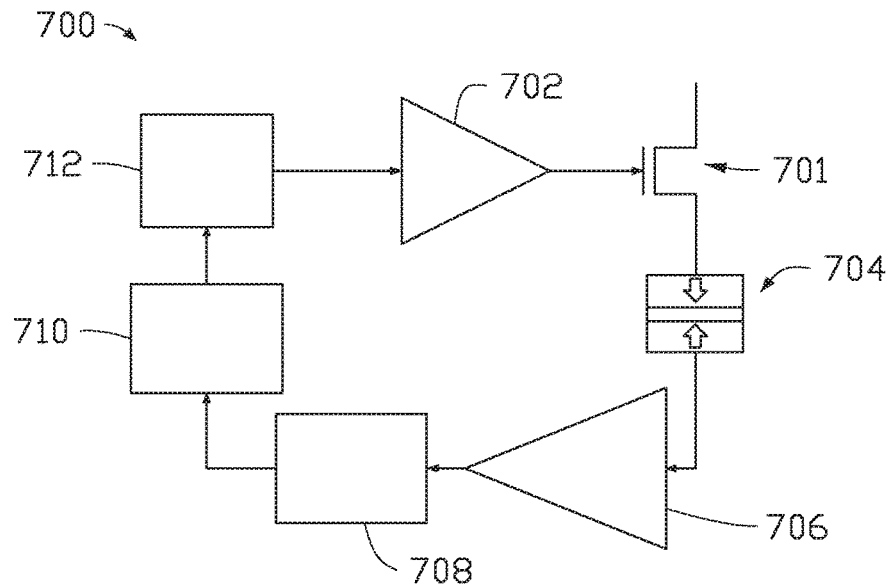
FIG. 7 illustrates a system for controlling the switching of an MRAM device with a state estimator, according to one embodiment.

FIG. 7 illustrates a system 700 for controlling switching of an MRAM device, according to one embodiment. The system 700 includes a write driver 702, a transistor 701, a MRAM device 704, a write sense amplifier 706, a filter 708, a state estimator 710, and a controller 712. The write driver 702 is configured to deliver a current or voltage to the MRAM device 704. The write driver 702 turns the transistor 701 on and off. When the transistor 701 is turned on, a voltage or current is applied to the MRAM device 704. The write sense amplifier 706 receives a signal from the MRAM device 704. The write sense amplifier 706 is configured to sense low power signals from a bit-line that represents a data bit (1 or 0) stored in memory during a write process, and amplify the small voltage swing to recognizable logic levels so that the data can be written properly. In one embodiment, the signal feeding into the write sense amplifier 706 is attenuated so that the current does not saturate the write sense amplifier. For example, the signal may be attenuated with one attenuation value during a read during write operation and with a different or no attenuation value during a read after write operation. The filter 708 is configured to remove unwanted components from the signal transferred from the write sense amplifier 706. In one embodiment, the filter 708 may be an equalizer. In another embodiment, the filter 708 may be a tapped delay line. The filter 708 feeds into the state estimator 710. The state estimator 710 is configured to estimate the state of the MRAM device 704. For example the state estimator 710 may estimate whether the MRAM device 704 has high or low voltage. The state estimator 710 communicates with the controller 712 to determine whether the current provided to the MRAM device 704 should be turned on or off. For example, the controller 712 may take in instructions to write a 1 bit or a 0 bit. The state that is desired to write is then compared to the estimate from the state estimator 710. Based on this comparison, the controller 712 may turn the current on or off.

Figure 8:
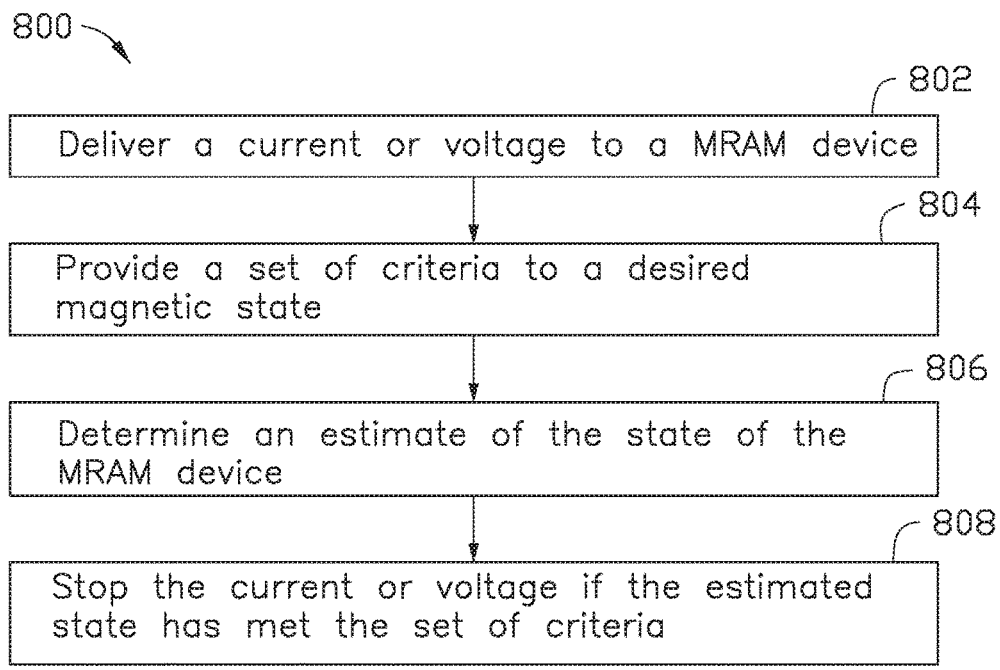
FIG. 8 illustrates an improved method of switching an MRAM device, according to another embodiment.

FIG. 8 illustrates a method 800 of controlling switching of an MRAM device, according to another embodiment. The MRAM device may be element 400 in FIG. 4. The method may use the system 700 in FIG. 7. The method 800 begins at step 802. At step 802 a programming current or programming voltage is delivered to the MRAM device. For example, the write driver 702 may provide the current or programming voltage to the MRAM device by turning on the transistor 701. When the transistor 701 is turned on, a voltage or current is able to be applied to the MRAM device.

At step 804, a set of criteria that corresponds to a desired magnetic state is provided. For example, a user may provide the set of criteria, such as writing a 0 or a 1, to the controller 712.

At step 806, the state estimator 710 determines an estimate of the state of the MRAM device. For example the state estimator 710 may estimate whether the MRAM device 704 has high or low resistance. The state estimator 710 communicates with the controller 712 to determine whether the current provided to the MRAM device 704 should be turned on or off.

At step 808, if the controller determines that the state estimated by the state estimator 710 adequately meets the set of criteria provided to the controller 712 in step 804, then the current or voltage delivered to the MRAM device 704 is stopped. For example, if the set of criteria required that a 1 bit was to be written, then the controller 712 would stop the current if the state estimator predicts that the MRAM device was in the 1 bit state.

As shown is an improved method for controlled switching of an MRAM device in real time. Controlling switching of the MRAM device in real time improves the write reliability of MRAM devices and compensates for differences of switching times among MRAM cells.

While the foregoing is directed to embodiments of the present disclosure, other and further embodiments of the disclosure may be devised without departing from the basic scope thereof, and the scope thereof is determined by the claims that follow.

What is claimed is:

1. A method for controlling switching of a magnetoresistive random access memory (MRAM) device, comprising:
   delivering a current to the MRAM device, wherein the MRAM device is in a first state;
   measuring a voltage drop across the MRAM device in real-time with a resistance detector, wherein a voltage drop beyond a threshold voltage equates to switching from a first state to a second state, the first state different from the second state;
   determining whether the MRAM device has switched from the first state to the second state; and
   stopping the current delivered to the MRAM device;
   wherein responsive to determining that the MRAM device has switched from the first state to the second state comprises determining that the voltage drop across the magnetoresistive random access memory device exceeds a threshold value;
   wherein determining that the voltage drop across the MRAM device exceeds a threshold value comprises:
      applying a burst mode extraction technique of the write sense signal, the burst mode extraction technique, comprising:
         generating a detected signal having a frequency that matches the frequency of oscillation of the free layer between the first state and the second state; and
         generating a phase signal that is aligned with the phase of the oscillation of a magnetization between the first state and the second state.

2. The method of claim 1, wherein a write drive provides the current to the MRAM device.

3. The method of claim 1, further comprising:
   continuing to provide the current to the MRAM device and measuring the voltage drop across the MRAM device in real-time responsive to determining that the voltage drop across the MRAM device does not exceed a threshold value.

4. The method of claim 1, wherein a controller communicates between the resistance detector and the write drive to control delivery of current to the MRAM device.

5. A system for controlling switching of a magnetoresistive random access memory (MRAM) device, comprising:
   a write drive configured to deliver a current to the MRAM device;
   a resistance detector in parallel with the MRAM device, wherein the resistance detector measures a voltage drop across the MRAM device in real-time; and
   a controller configured to compare the voltage drop measured by the resistance detector to a threshold value, communicate with the write drive to provide the write current until the threshold value is met, and determine whether the voltage drop across the MRAM device exceeds a threshold value, the determining that the voltage drop across the MRAM device exceeds a threshold value comprising:
   applying a burst mode extraction technique of the write sense signal, the burst mode extraction technique, comprising:
      generating a detected signal having a frequency that matches the frequency of oscillation of the free layer between the first state and the second state; and
      generating a phase signal that is aligned with the phase of the oscillation of a magnetization between the first state and the second state.

6. The system of claim 5, wherein the controller determines whether the voltage drop across the MRAM device exceeds the threshold value.

7. The system of claim 5, wherein the resistance detector uses a burst mode extraction technique to measure the voltage drop across the MRAM device in real-time.

8. The system of claim 5, wherein the resistance detector uses an equalize and peak detect technique to measure the voltage drop across the MRAM device in real-time.

9. The system of claim 5, wherein meeting the threshold value corresponds to magnetization of a free layer in the MRAM device switching from a first state to a second state.

* * * * *